United States Patent [19]

Matsumoto

[11] Patent Number: 5,179,036
[45] Date of Patent: Jan. 12, 1993

[54] PROCESS FOR FABRICATING BI-CMOS INTEGRATED CIRCUIT

[75] Inventor: Ryoichi Matsumoto, Tokyo, Japan

[73] Assignee: OKI Electric Industry Co., Ltd., Tokyo, Japan

[21] Appl. No.: 686,429

[22] Filed: Apr. 17, 1991

[30] Foreign Application Priority Data

Apr. 27, 1990 [JP] Japan ............................ 2-110314

[51] Int. Cl.⁵ .................. H01L 21/70; H01L 27/00
[52] U.S. Cl. .................................. 437/59; 257/552
[58] Field of Search ......................... 437/59; 357/43

[56] References Cited

U.S. PATENT DOCUMENTS

| 4,637,125 | 1/1987 | Iwasaki et al. | 437/59 |
| 4,694,562 | 9/1987 | Iwasaki et al. | 437/43 |
| 4,956,305 | 9/1990 | Arndt | 437/59 |
| 4,965,220 | 10/1990 | Iwasaki | 437/59 |

FOREIGN PATENT DOCUMENTS

| 0150349 | 6/1989 | Japan | 437/59 |
| 0037765 | 2/1990 | Japan | 437/59 |
| 0143453 | 6/1990 | Japan | 437/59 |

*Primary Examiner*—Olik Chaudhuri
*Assistant Examiner*—Long Pham
*Attorney, Agent, or Firm*—Spencer, Frank & Schneider

[57] ABSTRACT

A process for fabricating a Bi-CMOS integrated circuit according to the present invention comprises the steps of growing a P-type epitaxial layer after formation of buried layers, forming N-type diffusion layers in the epitaxial layer for forming the P-channel MOS transistor, an NPN transistor and a PNP transistor.

8 Claims, 10 Drawing Sheets

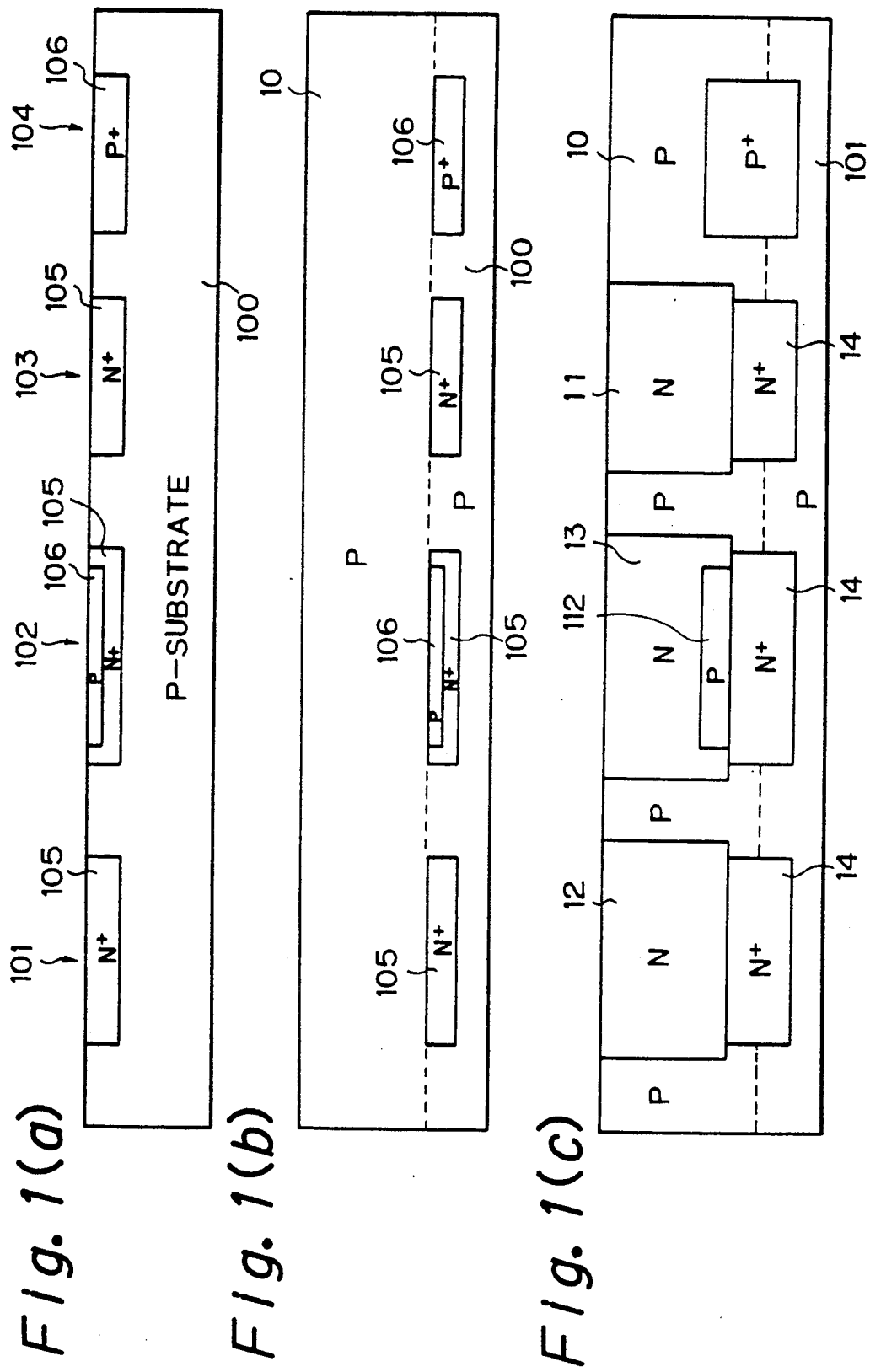

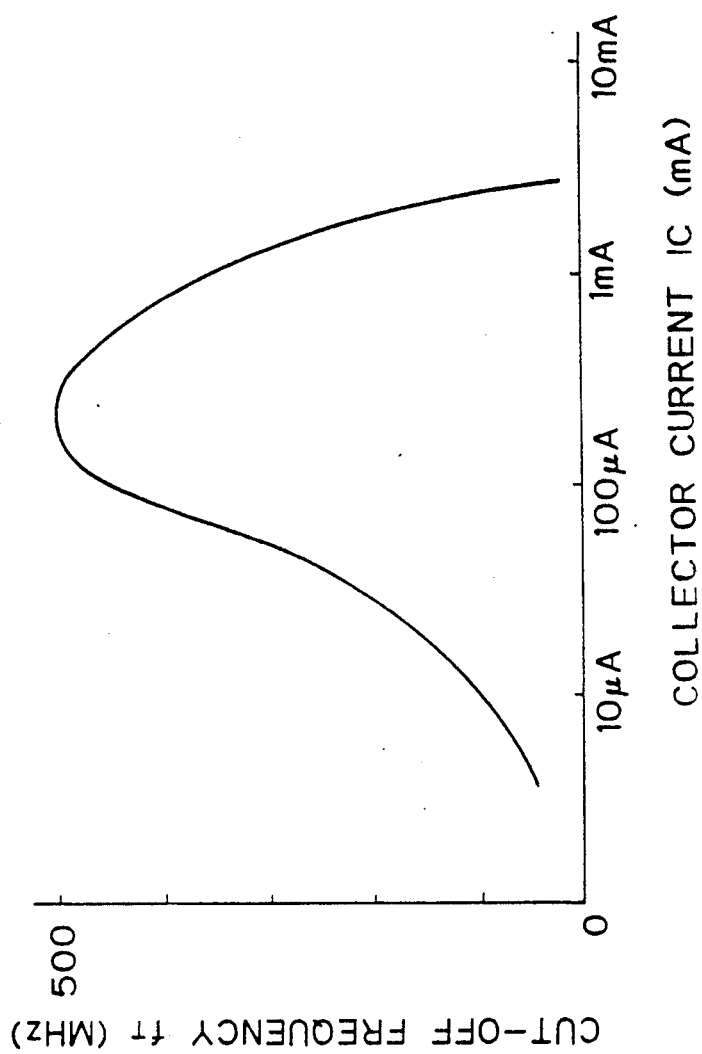

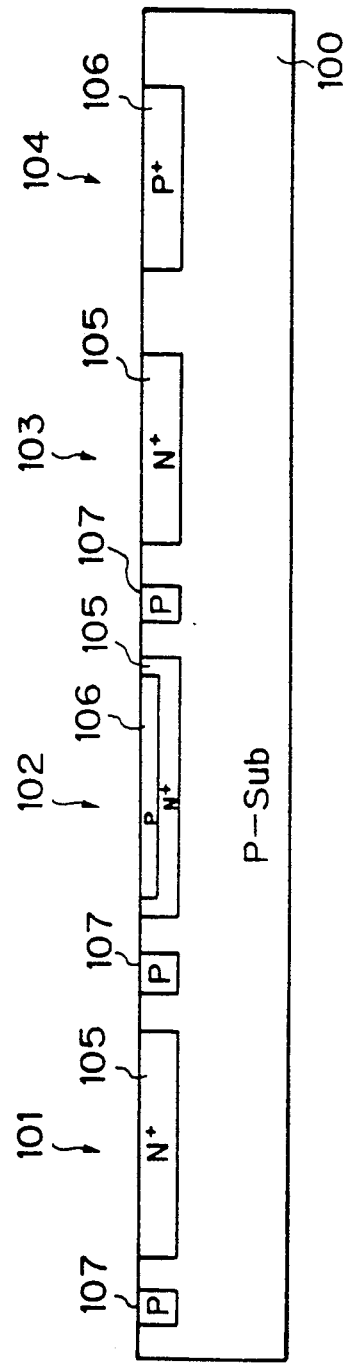
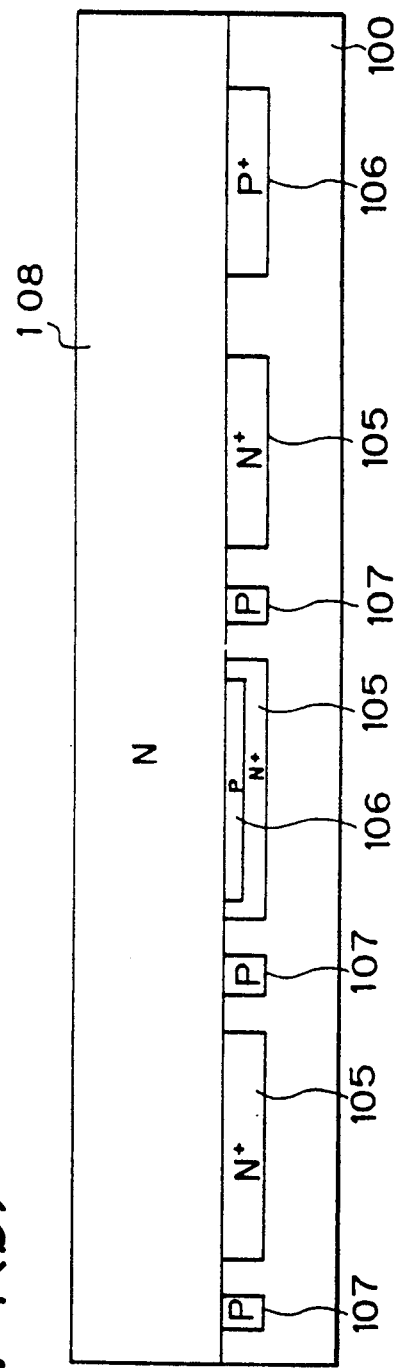
Fig. 4(a)
Fig. 4(b)

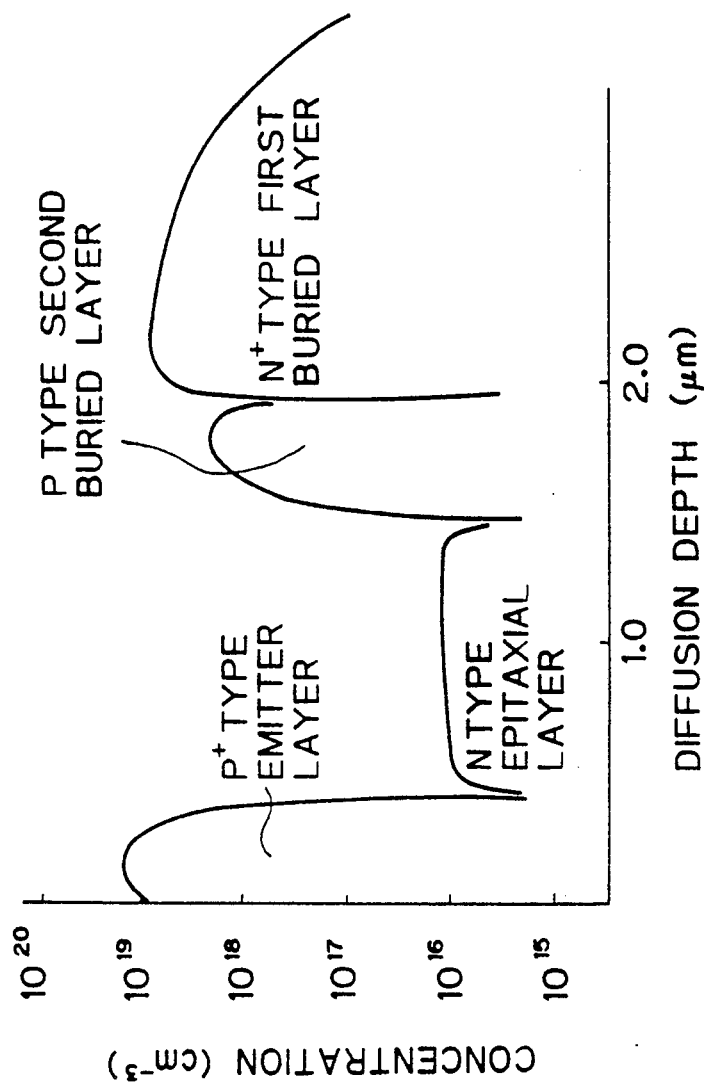

PROCESS FOR FABRICATING BI-CMOS INTEGRATED CIRCUIT

CROSS-REFERENCE TO RELATED APPLICATION

This application claims the right of priority under 35 U.S.C. 119 of Japanese Patent Application Serial No. 11034/1990 filed on Apr. 27, 1990, the entire disclosure of which is incorporated herein by reference.

BACKGROUND OF THE INVENTION

1. Field of the Invention

The present invention relates to a Bi-CMOS integrated circuit including a vertical type PNP bipolar transistor capable of operating at high speed.

2. Description of the Related Art

Conventionally, in Bi-CMOS integrated circuits, bipolar devices and CMOS devices have been formed on the same chip so that the driving capability of the CMOS devices are enhanced by the bipolar devices in order to obtain a high responsive CMOS. Although the Bi-CMOS integrated circuits have exhibited both bipolar and CMOS characteristics, they have not been able to give excellent functions such as high speed operation, high integration, high driving capability, low power consumption and the like.

A process of fabricating Bi-CMOS integrated circuits will be described hereinafter with reference to FIGS. 4(a) to (e).

As shown in FIG. 4(a), a first N-type buried layer 105 having a sheet resistance of 50 $\Omega/\square$ is formed on an NPN bipolar transistor forming region 101 of a P-type silicon substrate (hereinafter referred to as substrate) 100.

Also formed on a vertical type PNP (hereinafter referred to as V-PNP) bipolar transistor forming region 102 are the N-type first buried layer 105 and a P-type second buried layer 106 having a sheet resistance of 350 $\Omega/\square$ which is isolated from the substrate 100 by the N-type first buried layer 105.

The N-type first buried layer 105 is also formed on a P-channel MOS transistor forming region 103 and the P-type second buried layer 106 is also formed on an N-channel MOS transistor forming region 104. The first isolation layers 107 are formed on the substrate 100 for isolating an element in the NPN bipolar transistor forming region 101 and an element in the V-PNP bipolar transistor forming region 102 respectively at the same time that the P-type second buried layer 106 is formed using a known photolithography technique and an ion implantation and an annealing technique.

Subsequently, as shown in FIG. 4(b), an N-type epitaxial film 108 having the N-type impurity concentration of $1.5 \times 10^{16}$ atoms/cm$^3$ is deposited and grown in the thickness of 2 to 4 $\mu$m on the surface of the substrate 100 using an epitaxial technique. Then, as shown in FIG. 4(c), there are formed on the N-type epitaxial film 108 a second isolation layer 109 for isolating elements and a P-type region (hereinafter referred to as P-region) 110 for forming an N-channel MOS transistor thereon respectively having surface concentration of 2E16 atoms/cm$^3$ and diffusion depth of 1-2 $\mu$m so that the previously buried first isolation layers 107 and second isolation layers 109 are connected with each other, and the P-region 110 and the P-type region 111, formed by the out diffusion of second buried layer 106 in the device forming region 104 are connected with each other.

Whereupon, inasmuch as the first isolation layers 107 are formed of antimony and the second isolation layers 109 are formed of boron, the second P-type buried layer 106 is diffused more deeply upward in the N-type epitaxial film 108 than the N-type first buried layer 105 at the V-PNP bipolar transistor forming region 102. As a result, over the first N-type buried layer 105 there is formed a P-type buried layer 112 serving as a collector of the V-PNP bipolar transistor 102 isolated from the substrate 100.

Thereafter, LOCOS oxide films 113 are formed due to isolation of MOS device in the thickness of about 7000 angstroms by the LOCOS (localized oxidation of silicon) method on the substrate as shown in FIG. 4(d) which has therein the second isolation layers 109, the P-region 110 and the second buried layer 111.

Then, a layer 114 forming a collector contact of the NPN bipolar transistor is formed by diffusion of the N-type impurity. Successibly, a layer 115 for forming a collector contact of the V-PNP transistor is formed by diffusion of the P-type impurity to reach the P-type buried layer 112.

Then, a P-type layer 116 for forming a base of the NPN transmitter is formed with a surface concentration of 5E17 atoms/cm$^3$, and in a diffusion depth of 0.6 $\mu$m.

As shown in FIG. 4(e), on the substrate set forth above a gate oxide film 117 and a polysilicon gate 118, using a known MOS gate forming technique, are formed for the MOS transistors.

Then, there are formed a layer 119 for forming an emitter of the NPN bipolar transistor and a layer 120 for forming a base contact of the V-PNP transistor and a layer 121 for forming a source and a drain (hereinafter referred to as source/drain) of the N-channel MOS transistor using an arsenic implantation technique.

There are formed a layer 122 for forming a base contact of the NPN bipolar transistor, a layer 123 for forming an emitter of the V-PNP bipolar transistor and a layer 124 for forming a source/drain of the P-channel MOS transistor using a BF$_2$ ion implantation technique.

Thereafter, the Bi-CMOS structure is completed by opening contact holes for wiring each of the elements and applying aluminum electrodes using a known technique whose detailed description is omitted.

The Bi-CMOS integrated circuit fabricated in the process set forth above has a concentration characteristics as illustrated in FIG. 5 and a high-frequency characteristics as illustrated in FIG. 6. That is, inasmuch as the V-PNP bipolar transistor has a base layer formed by the N-type epitaxial film having a uniform concentration as shown in FIG. 5, the high-frequency characteristics thereof, i.e., a cut-off frequency $f_T$ becomes about 200 MHz, which results in reducing the operation speed at one tenth or less of the other Bi-CMOSs.

Since the base region in the PNP bipolar transistor is formed of the epitaxial layer having a uniform concentration, the minority carriers injected from the emitter region to the base region are not subjected to an electric field aiding effect.

Accordingly, there was a problem that the Bi-CMOS integrated circuit is deteriorated in its $f_T$-IC characteristic compared with the PNP bipolar transistor having a diffused base which is known by the following equation.

$$\tfrac{1}{2}\pi f_T = \tau e + \tau b + \tau x + \tau c \tag{1}$$

where a second term τb (base time constant) is largest and is expressed as:

$$\tau b = W_B^2 / nD_B \qquad (2)$$

where $W_B$ is a base width, n is a constant dependent on minority carrier distribution in the base and $D_B$ is a diffusion constant of the minority carrier concentration in the base.

The epitaxial PNP bipolar transistor is a transistor having normally a uniform base so that it is not influenced by the electric field aiding effect caused by a diffusion gradient. As a result, the base time constant of the epitaxial PNP bipolar transistor τb is greater than but the cut-off frequency $f_T$ thereof is less than those of the transistor having the diffused base.

Another fabrication process has been proposed to solve the problem set forth above.

Firstly, in FIG. 4(f) over the surface of the substrate 100 as illustrated in FIG. 4(a), the N-type epitaxial film 108 having an N-type impurity concentration of 1.5E 15 atoms/cm³ is formed in the depth of 2 to 4 μm. Secondly, second isolation layers 109 for isolating each element and a P-region 110 for forming the N-channel MOS transistor are formed at the same time with the surface concentration of $2 \times 10^{16}$ atoms/cm³ in the depth of 1 to 2 μm, then the first isolation layers 107 are connected to the second isolation layers 109 and the second buried layer 111 is connected to the P-region 110. By such an arrangement, over the first buried layer 105 at the V-PNP bipolar transistor forming region 102 there is formed the P-type buried layer 112 serving as the collector of the V-PNP bipolar transistor.

Thereafter, an N-type diffusion region (hereinafter referred to as N-region) 125 for forming the P-channel MOS transistor is formed and the same N-region 125 having the surface concentration $5 \times 10^{16}$ atoms/cm³ with the diffusion depth of 1 to 2 μm is formed at the V-PNP transistor bipolar transistor forming region 102 to reach the P-type buried layer 112.

Then, there are formed, as shown in FIG. 4(g), the LOCOS oxide film 112, the N-type layer 114 for forming the collector contact of the NPN bipolar transistor and the base layer 116 of the NPN bipolar transistor in the same manner as in FIG. 4(d).

Thereafter, in the same way as in FIG. 4(e), there are formed respectively the gate oxide film 117, the polysilicon gate 118, the emitter layer 119 of the NPN bipolar transistor, the layer 120 for forming the base contact of the V-PNP bipolar transistor, the source/drain 121 of the N-channel MOS transistor, the layer 122 for forming the base contact of the NPN bipolar transistor, emitter layer 123 of the V-PNP bipolar transistor and the source/drain 124 of the P-channel MOS transistor.

According to the process set forth above, the V-PNP bipolar transistor can be formed in the N-region which is formed by the diffusion technique so that the cut-off frequency $f_T$ is improved. However, the N-type epitaxial film should have the low concentration, i.e. the N-type impurity concentration of $1.5 \times 10^{15}$ atoms/cm³ to form the due to the MOS characteristics and the concentration of the N-region should be sufficiently lower than the same value in view of the process margin.

However, in the case of the Bi-CMOS integrated circuit including the V-PNP bipolar transistor, the surface concentration of the P-type second buried layer 111 formed of boron should be high and the area thereof should be large in view of the wafer so that an auto-doping phenomenon occurs in the wafer per se when the wafer epitaxial film is formed. Therefore, it was difficult to control the N-type specific resistivity of the epitaxial film to the low concentration.

Accordingly, when the control characteristics of the concentration of the N-type epitaxial film is improved in the conventional fabrication process, the high frequency characteristics are determined because the concentration of the base of the bipolar transistor becomes uniform, while when the high frequency characteristics are improved, the high frequency characteristics is deteriorated so that the control of the N-type epitaxial film becomes difficult. The relationship between the control of the concentration and the high frequency characteristics is a so-called tradeoff, and hence, quick improvement thereof has been demanded.

SUMMARY OF THE INVENTION

It is an object of the present invention to provide a process for fabricating a Bi-CMOS integrated circuit capable of improving the control characteristics of the concentration of an epitaxial film and also improving the high frequency characteristics.

To achieve the above object, the present process comprising the steps of forming an epitaxial film on the substrate, the epitaxial film having the surface concentration which is lower than that of a P-channel portion of a P-channel MOS transistor, forming a PNP bipolar transistor forming region and a P-channel MOS transistor forming region respectively formed on the epitaxial film, both the PNP bipolar transistor forming region and the P-channel MOS transistor forming region having N-type buried layers, forming N-regions by diffusing N-type buried layers, forming N-regions by diffusing N-type impurities having concentration higher than that of P-type impurity in the epitaxial film and connected to the N-type buried layers and forming an PNP bipolar transistor and a P-channel MOS transistor on the N-regions.

According to the present invention, inasmuch as the epitaxial film is formed of a P-type material having low concentration, i.e. the concentration lower than that of the surface concentration of the P-channel portion of the N-channel MOS transistor, it is possible to control an auto-doping phenomenon at the low concentration which occurs when boron is doped in the epitaxial film in the fabrication of the Bi-CMOS including V-PNP bipolar transistor.

Furthermore, according to the present invention, inasmuch as there is formed the P-type epitaxial film having low concentration, it is possible to form a diffusion layer on the PNP bipolar transistor forming region. Accordingly, it is possible to form the N-type base layer of the bipolar transistor having an impurity concentration gradient for the electric field aiding effect which entails the improvement of the high frequency characteristics of the bipolar transistor.

Still, furthermore, according to the present invention, inasmuch as the P-type epitaxial film having low concentration is formed, it is possible to form a diffusion layer in the epitaxial film while the diffusion layer has a concentration of $5 \times 10^{16}$ atoms/cm² determined by the MOS characteristics in the MOS transistor forming region.

BRIEF DESCRIPTION OF THE DRAWINGS

These and other features and advantages of the invention may be more completely understood from the following detailed description of the preferred embodiment of the invention with reference to the accompanying drawings in which:

FIGS. 1(a) to (e) are cross sectional views showing a process of fabricating a Bi-CMOS integrated circuit according to an embodiment of the present invention;

FIG. 3 is a graph showing the relationship between cut-off frequency ($f_T$) and current in the collector (Ic) in the V-PNP bipolar transistor fabricated by the process of the present invention;

FIG. 5 is a graph showing the relationship between the concentration and depth of diffusion in a V-PNP bipolar transistor fabricated by the related process.

DETAILED DESCRIPTION OF THE INVENTION

Figure 1D:
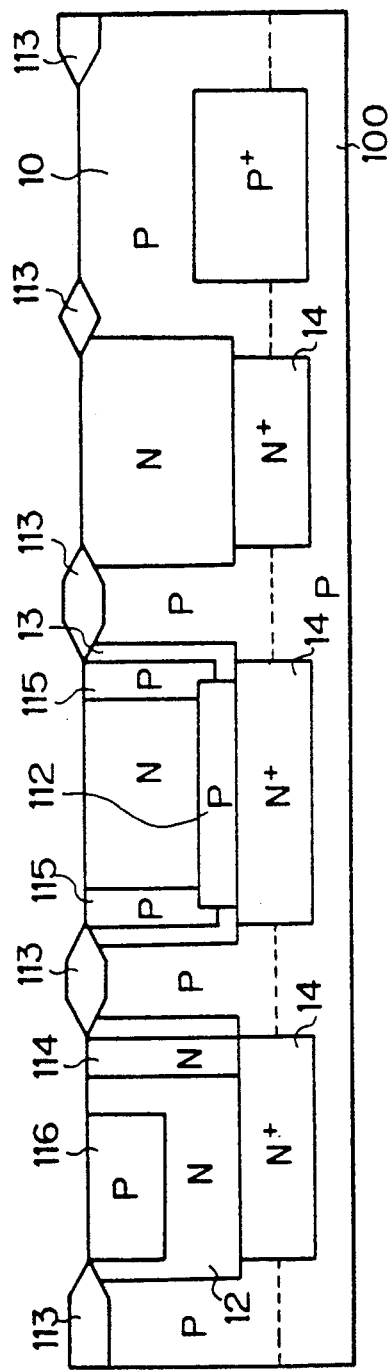

Explanation will be made of a process of fabricating a Bi-CMOS integrated circuit according to the present invention with reference to the drawing in which like reference characters are used to designate like or corresponding part throughout the drawings which schematically illustrates these parts for the sake of understanding.

Accordingly, dimensions, shapes and arrangements which will be explained in the following preferred embodiment are only of illustrative purposes and are not of restrictive purposes, and therefore, the conception or technical scope of the present invention should not be limited to these preferred embodiment.

As shown in FIG. 1(a), there is formed on an NPN bipolar transistor forming region 101 of a P-type silicon substrate (hereinafter referred to as substrate) 100 a N-type first buried layer 105 having a sheet resistance of 50 Ω/□ using a known photolithography and ion implantation and an annealing technique.

There is formed on a V-PNP bipolar transistor forming region 102 of the substrate 100 the N-type first buried layer 105 and a P-type second buried layer 106 inside the N-type first buried layer 105 isolated by the N-type first buried layer 105 from the substrate 100 and having a sheet resistance 350 Ω□ using a known photolithography and ion implantation and an annealing technique.

Furthermore, the N-type first buried layer 105 is also formed on a P-channel MOS transistor forming region 103 and the second buried layer 106 is formed on an N-channel MOS transistor forming region 104 using a known photolithography and ion implantation and an annealing technique.

Subsequently, as shown in FIG. 1(b), a P-type epitaxial film 10 having the impurity concentration of $1.5 \times 10^{15}$ atoms/cm$^3$ is deposited and grown int he thickness of 2 to 4 μm on the surface of the substrate 100 using an epitaxial technique. Then, as shown in FIG. 1(c), there are formed an N-type diffused 11 for forming a P-channel MOS transistor, for forming an NPN bipolar transistor and for forming the V-PNP bipolar transistor, all of which are greater than the N-type first buried layer 105 of the V-PNP bipolar transistor forming region 102 in the sizes thereof and have a surface concentration of $5 \times 10^{16}$ atoms/cm$^3$ with a diffusion depth of 1 to 2 μm. Accordingly, the N-regions 11, 12 and 13 are connected to the first buried layers 14 previously buried in the substrate 100.

The first buried layer 14 connected to the N-region 11 for forming the P-channel MOS transistor and the first buried layer 14 connected to the N-region 12 for forming the NPN bipolar transistor correspond respectively to the first buried layer 105, while the first buried layer 14 connected to the N-region 13 of the V-PNP bipolar transistor correspond to the first and second buried layers 105 and 106.

Inasmuch as each of the N-regions 11, 12 and 13 are connected to the first buried layers 14 and the first buried layer 105 is formed of antimony and the second buried layer 106 is formed of boron, the second buried layer 106 is diffused upward into the epitaxial film 10 more than the first buried layer 105 at the V-PNP bipolar transistor region 102.

Accompanied by the diffusion of the second buried layer 106, a P-type buried layer 112 functioning as a collector of the V-PNP bipolar transistor isolated from the substrate 100 is formed on the first buried layer 14

Successively, there are formed LOCOS oxide films 113 on the substrate formed in the processes set for the above as shown in FIG. 1(d), and the LOCOS oxide films 113 have thickness of 7000 angstroms. Thereafter, a layer 114 for forming the collector contact of the NPN-bipolar transistor is formed by diffusion of the N-type impurity.

A P-type diffusion layer 115 for forming the collector contact of the V-PNP bipolar transistor is formed inside the N-region 13 for forming the V-PNP bipolar transistor to reach the P-type buried layer 112 by diffusion a P-type impurity.

Figure 4C:
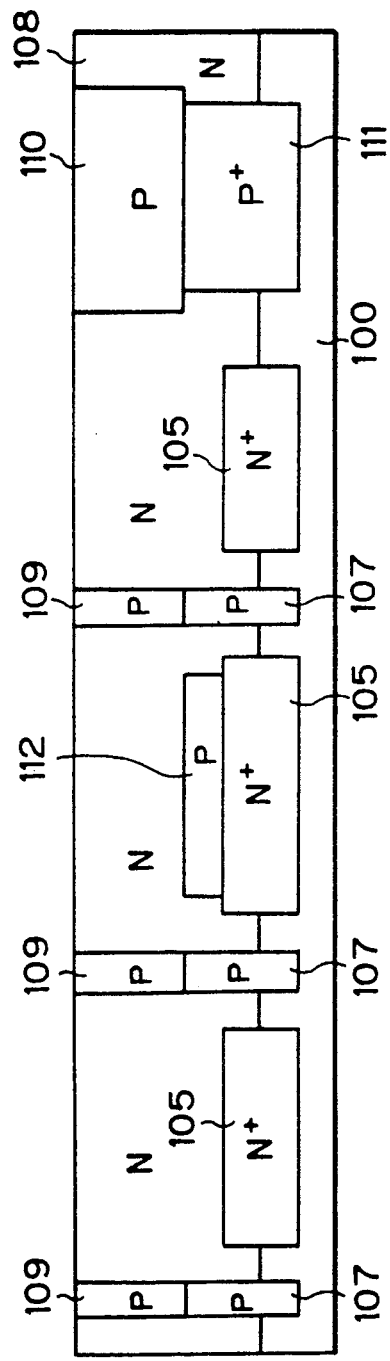
FIG. 4(a) to (e) are cross sectional views showing a related process for fabricating a Bi-CMOS integrated circuit.
Figure 4D:
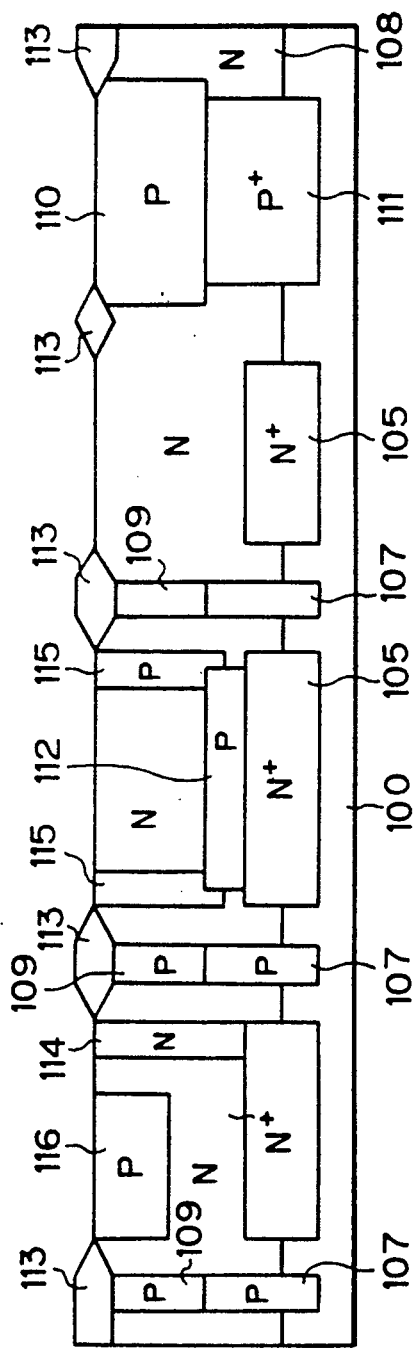
Figure 4E:
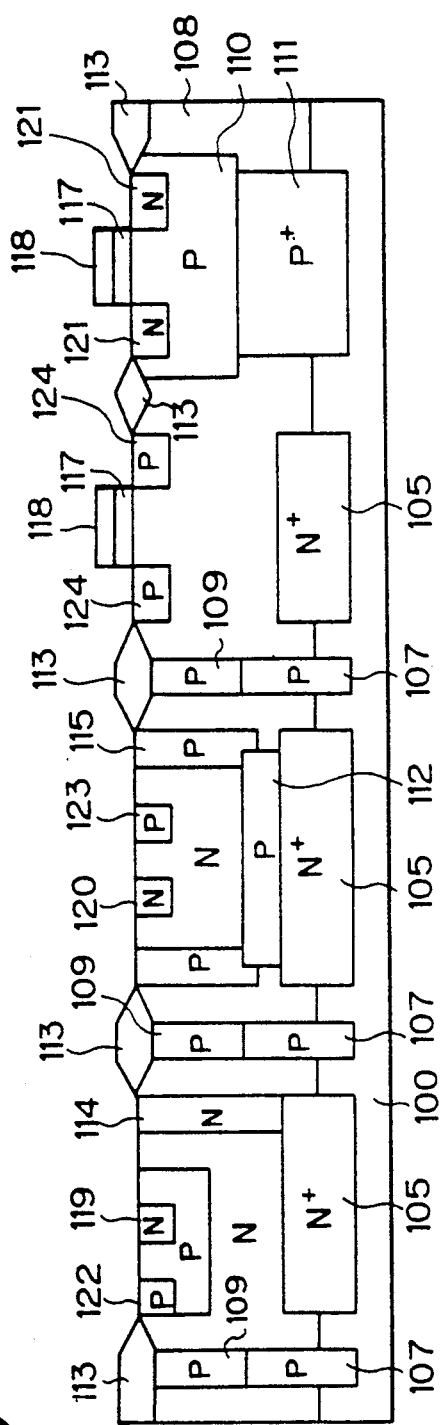
Figure 4F:
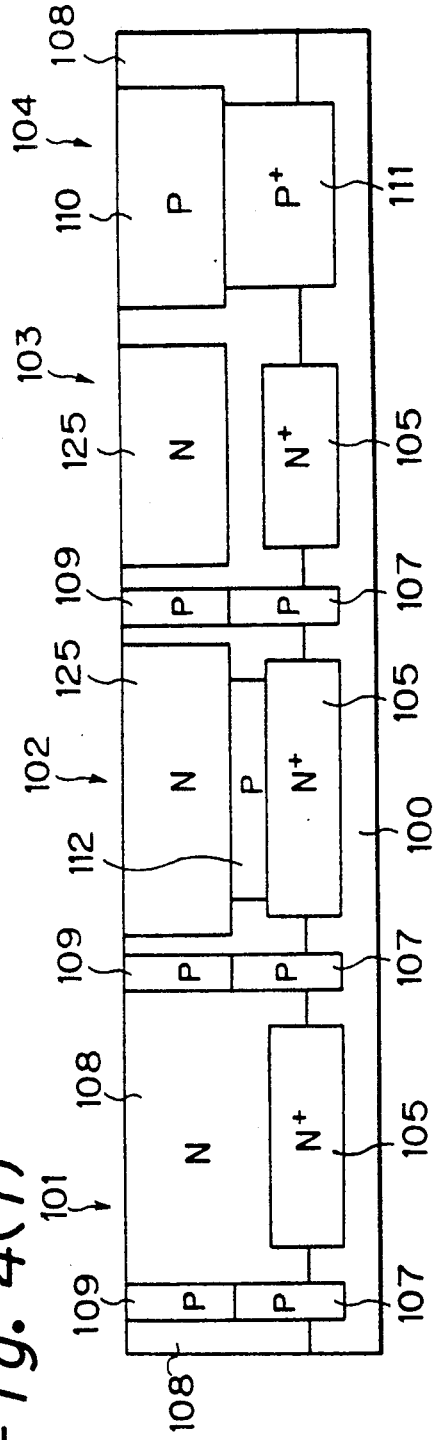
FIGS. 4(f) and (g) are cross sectional views showing a further related process for fabricating another Bi-CMOS integrated circuit.
Figure 4G:
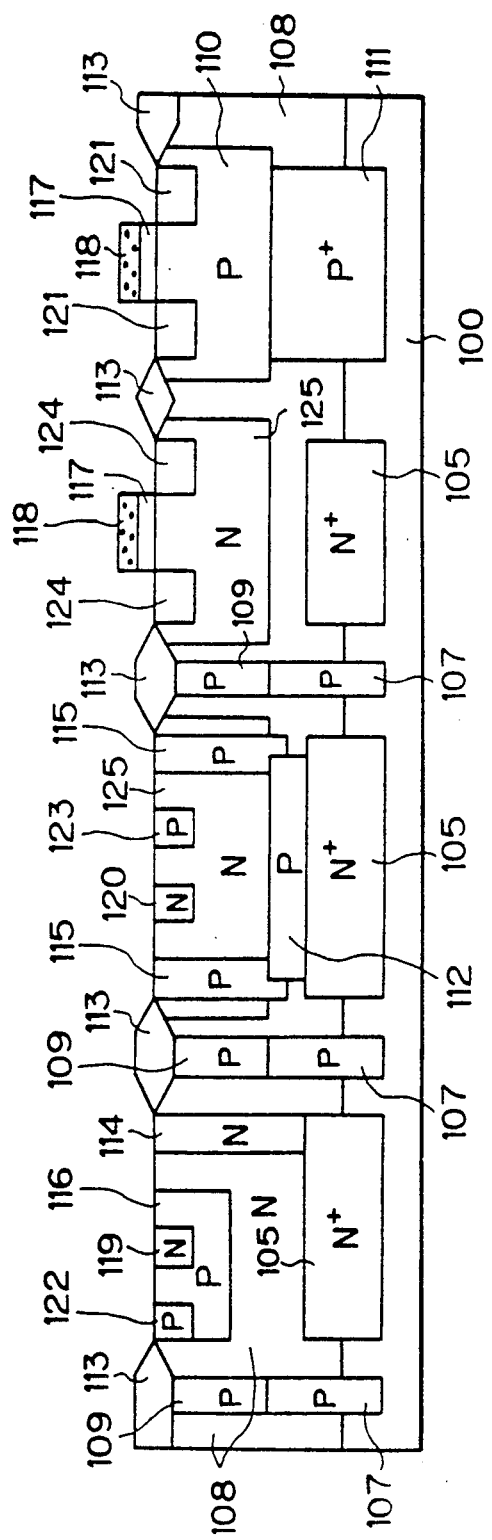
Figure 6:
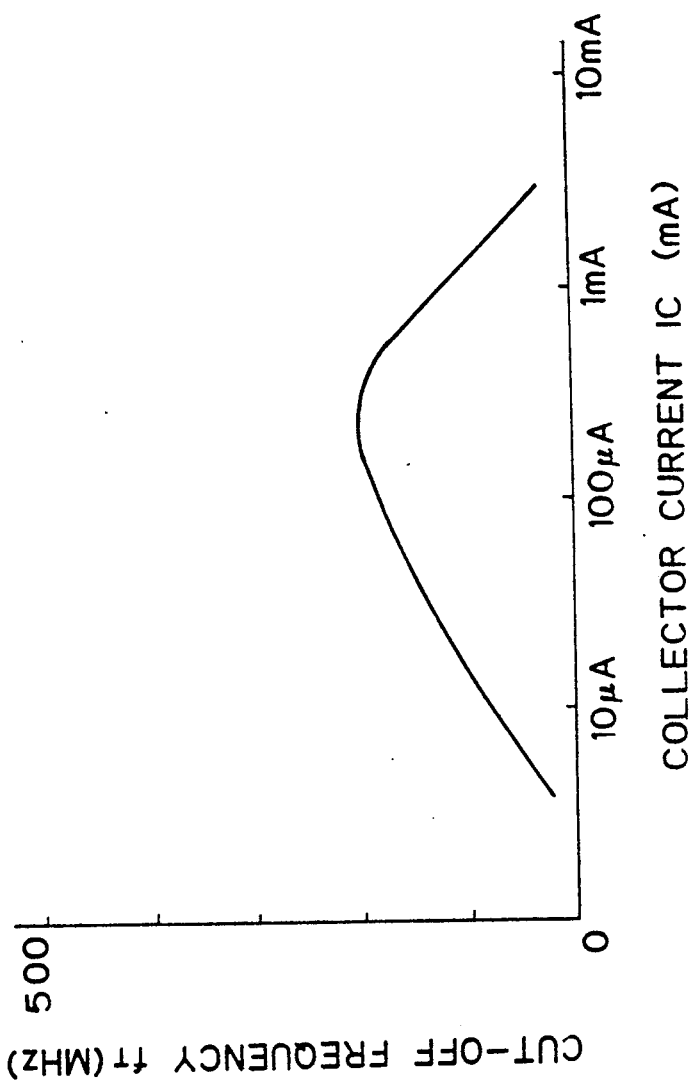
FIG. 6 is a view showing the relationship between cut-off frequency ($f_T$) and current in the collector (Ic) in the V-PNP bipolar transistor fabricated by the related process.

Thereafter, there is formed a P-type diffusion layer 116 as a base of the NPN bipolar transistor, have the surface concentration of $5 \times 10^{17}$ atoms/cm$^3$ with a diffusion depth of 0.6 μm. Then, there are formed a gate oxide film 117 and a polysilicon gate 118 on the semiconductor substrate as shown in FIG. 1(e) using the known MOS gate forming technique and in a manner similar to that of FIG. 4(e).

Figure 1E:
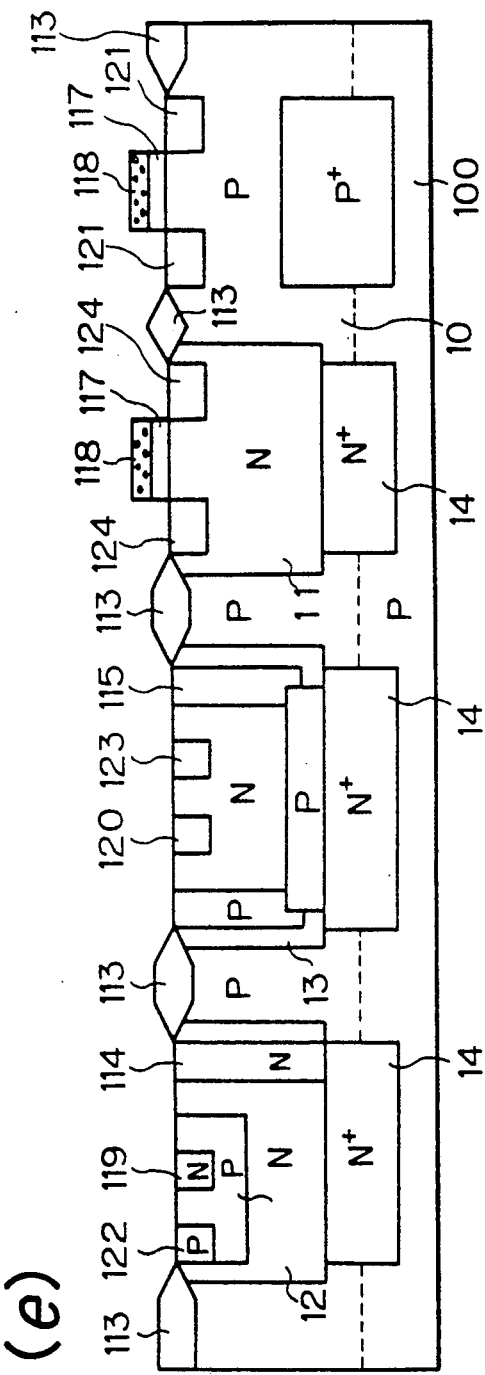
Figure 2:
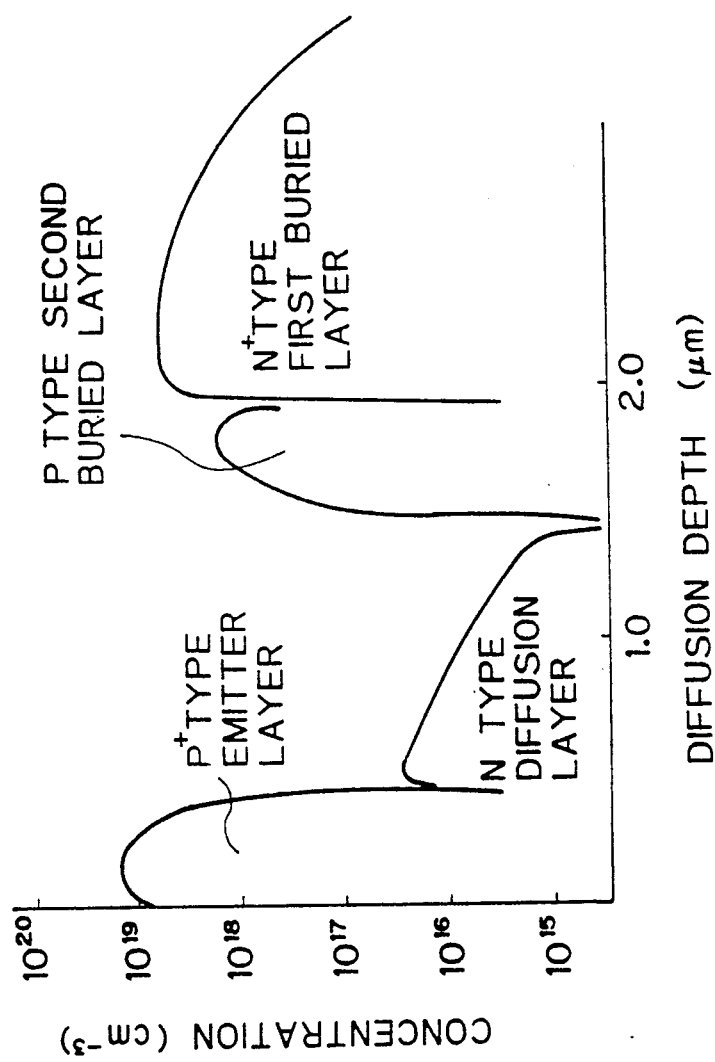
FIG. 2 is a view showing relationship between a concentration and a depth of diffusion in a V-PNP bipolar transistor fabricated by the process of the present invention.

Successively, as shown in FIG. 1(e), N-type diffusion layers as an emitter 119 of the NPN bipolar transistor, as a base contact 120 of the V-PNP bipolar transistor as a source/drain 121 of the N-channel MOS transistor are formed using an arsenic implantation technique, and P-type diffused layers as a base contact 122 of the NPN bipolar transistor as an emitter 123 of the V-PNP bipolar transistor and as a source/drain 124 of the P-channel MOS transistor are formed using a BF$_2$ ion implantation technique. thereafter, the process of the Bi-CMOS integrated circuit is accomplished after opening contact holes for wiring each of the elements and applying aluminum electrodes using the known technique.

Inasmuch as the P-type epitaxial film 10 is formed after formation of the first buried layer 105 and the second buried layer 106 according to the first embodiment, it is possible to sufficiently control the occurrence of the auto-doping phenomenon which occurs when boron is doped in the epitaxial film in the fabrication of the Bi-CMOS including a V-PNP bipolar transistor. Furthermore, since the N-type diffusion layer 13 as a base can be formed on the V-PNP bipolar transistor forming region 102, it is possible to provide the impurity concentration gradient in the layer 13 for forming the N-type base for the electric field aiding effect.

Accordingly, the cut-off frequency $f_T$-Ic characteristics of the V-PNP bipolar transistor which shown that the high frequency characteristics can be improved.

Still furthermore, when the elements are isolated, the N-regions of the active regions have the N-type diffusion which results in elimination of formation of the P-type buried layer in the isolation region. As a result, the auto-doping phenomenon has less occurred when the epitaxial film is formed.

What is claimed is:

1. A process for fabricating a Bi-CMOS integrated circuit comprising the steps of:
    (a) forming simultaneously on a P-type semiconductor substrate N-type buried layers in a P-channel MOS transistor forming region, a PNP transistor forming region and an NPN transistor forming region;
    (b) forming simultaneously on the semiconductor substrate a collector forming P-type region having the size smaller than the associated respective N-type buried layer in the PNP transistor forming region, and a P-type buried layer in an N-channel MOS transistor forming region;
    (c) forming on the semiconductor substrate a P-type epitaxial film having a first surface concentration;
    (d) forming diffused N-type regions, each having a size larger than that of the associated respective N-type buried layer and a second surface concentration greater than said first surface concentration, in the P-type epitaxial film in the PNP transistor forming region, the NPN transistor forming region and the P-channel MOS transistor forming region, with the diffused N-type regions being connected with the respective N-type buried layers in the NPN transistor and P-channel MOS transistor forming regions and with the collector forming P-type region in the PNP transistor forming region;
    (e) forming an NPN transistor in the NPN transistor forming region, a vertical PNP transistor in the PNP transistor forming region, with the respective diffused N-type region being the base of the PNP transistor, and a P-channel MOS transistor in the P-channel MOS transistor forming region, whereby the concentration of a channel portion of the P-channel MOS transistor is higher than said first surface concentration and
    (f) forming an N-channel MOS transistor in the N-channel MOS transistor forming region.

2. A process for fabricating a Bi-CMOS integrated circuit comprising the steps of:
    (a) preparing a semiconductor substrate having thereon an NPN transistor forming region, a PNP transistor forming region, a P-channel MOS transistor forming region and an N-channel MOS transistor forming region;
    (b) forming N-type first buried layers simultaneously on the NPN transistor forming region, the PNP transistor forming region and the P-channel MOS transistor region;
    (c) forming P-type second buried layers simultaneously on the PNP transistor forming region as a collector of the PNP transistor and on the N-channel MOS transistor forming region after formation of the N-type first buried layers;
    (d) forming on the semiconductor substrate a P-type epitaxial film having a surface concentration lower than that of a channel portion of a P-channel MOS transistor; and
    (e) forming N-type diffusion layers on the NPN transistor region as a collector of the NPN transistor, on the PNP transistor forming region as a base of the PNP transistor and on the P-channel MOS transistor forming region as a channel forming region of a P-channel MOS transistor, whereby a vertical PNP transistor can be formed in the PNP transistor forming region.

3. A process for fabricating a Bi-CMOS integrated circuit according to claim 2, further comprising the steps of forming a vertical type PNP bipolar transistor in the PNP transistor forming region, and spaced P-type source and drain regions in the N-type diffusion layer in the P-channel MOS transistor forming region.

4. A process for fabricating a Bi-CMOS integrated circuit according to claim 1, wherein said step of forming a vertical PNP transistor further comprises:
    (a) forming a collector contact region within the N-type diffused region of the PNP transistor forming region to reach the collector of the PNP transistor;
    (b) forming a base contact region on the surface of the N-type diffused region of the PNP transistor forming region; and
    (c) forming an emitter region on the surface of the N-type diffused region of the PNP transistor forming region.

5. A process of fabricating a Bi-CMOS integrated circuit according to claim 1, further comprising the step of forming isolation means between the respective transistor forming regions for causing each of the transistors to be electrically isolated.

6. A process for fabricating a Bi-CMOS integrated circuit according to claim 1 wherein said predetermined surface concentration of said epitaxial film is approximately $1.5 \times 10^{15}$ atoms/cm$^3$.

7. A process for fabricating a Bi-CMOS integrated circuit comprising the steps of:
    (a) preparing a P-type semiconductor substrate having thereon an NPN transistor forming region, a PNP transistor forming region, a P-channel MOS transistor forming region and an N-channel MOS transistor forming region;
    (b) simultaneously forming respective N-type first buried layers on the NPN transistor forming region, the PNP transistor forming region and the P-channel MOS transistor region;
    (c) simultaneously forming respective P-type second buried layers on the N-type first buried layer in the PNP transistor forming region as a collector of the PNP transistor, and on the N-channel MOS transistor forming region;
    (d) forming on the P-type semiconductor substrate a P-type epitaxial film having a first surface concentration lower than that of a channel portion of a P-channel MOS transistor;
    (e) forming respective N-type first diffusion layers in said epitaxial film in the NPN transistor region as a collector of the NPN transistor, in the PNP transistor forming region as a base of the PNP transistor and in the P-channel MOS transistor forming region, with said N-type first diffusion layers reaching the respective buried layers in said transistor forming regions and having a surface concentration greater than said surface concentration;

(f) forming a P-type second diffusion layer, as a base of an NPN transistor, in the first diffusion layer in the NPN transistor forming region;

(g) forming a P-type third diffusion layer, as a collector contact, in the first diffusion layer in the PNP transistor forming region;

(h) forming respective P-type fourth diffusion layers on the surface of the second diffusion layer as a base contact for the NPN transistor, on the surface of the first diffusion layer in the PNP transistor forming region as a emitter to form a vertical PNP transistor, and on the surface of the first diffusion layer in the P-channel MOS transistor forming region as source/drain; and (i) forming respective N-type fifth diffusion layer on the surface of the second diffusion layer as an emitter of the NPN transistor, on the surface of the first diffusion layer in the PNP transistor forming region as a base contact, and on the surface of the P-type epitaxial film as the source/drain.

8. A process for fabricating a Bi-CMOS integrated circuit as defined in claim 7 wherein said epitaxial layer has a surface concentration of approximately $1.5 \times 10^{15}$ atoms/cm$^3$ and said N-type first diffusion layers have a surface concentration of approximately $5 \times 10^{16}$ atoms/cm$^3$.

* * * * *